(12) United States Patent
Ma et al.

(10) Patent No.: US 9,659,801 B2
(45) Date of Patent: May 23, 2017

(54) HIGH EFFICIENCY BUFFER STOCKER

(71) Applicant: Taiwan Semiconductor Manufacturing Co., Ltd., Hsin-Chu (TW)

(72) Inventors: Kuo-Lei Ma, Hsin-Chu (TW); Chih-Hung Huang, Toufen Town (TW); Wen-Chung Chiang, Tanzih Township (TW); Min-Yu Hsieh, Hsin-Chu (TW); Fiona H. Lee, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 434 days.

(21) Appl. No.: 14/496,122

(22) Filed: Sep. 25, 2014

(65) Prior Publication Data
US 2016/0005633 A1 Jan. 7, 2016

Related U.S. Application Data

(62) Division of application No. 13/646,755, filed on Oct. 8, 2012, now abandoned, which is a division of (Continued)

(51) Int. Cl.
*B65G 37/02* (2006.01)
*H01L 21/677* (2006.01)
(Continued)

(52) U.S. Cl.
CPC ........ *H01L 21/67736* (2013.01); *B65G 37/00* (2013.01); *B65G 37/02* (2013.01); *B66C 19/00* (2013.01); *H01L 21/6773* (2013.01); *H01L 21/67715* (2013.01); *H01L 21/67733* (2013.01); *H01L 21/67769* (2013.01); *B65G 2201/0297* (2013.01)

(58) Field of Classification Search
CPC .......... H01L 21/6773; H01L 21/67736; B65G 37/02
USPC .................... 198/347.1–347.4; 414/626, 940
See application file for complete search history.

(56) References Cited

U.S. PATENT DOCUMENTS 2,729,531 A 1/1956 Anderson
2,881,041 A 4/1959 Liebman
(Continued)

OTHER PUBLICATIONS

"belt." The American Heritage Dictionary of the English Language, Fourth Edition, Houghton Mifflin Company, 2004, Sep. 21, 2009. <Dictionary.com http://dictionary.reference.com/browse/belt>.

*Primary Examiner* — Jonathan Snelting
(74) *Attorney, Agent, or Firm* — Duane Morris LLP

(57) ABSTRACT

A high-efficiency buffer stocker is disclosed. The buffer stocker includes an overhead transport track for supporting overhead transport vehicles carrying wafer containers and at least one conveyor system or conveyor belt provided beneath the overhead transport track for receiving the wafer containers from the overhead transport vehicles on the overhead transport track. The buffer stocker is capable of absorbing the excessive flow of wafer containers between a processing tool and a stocker, for example, to facilitate the orderly and efficient flow of wafers between sequential process tools in a semiconductor fabrication facility, for example.

20 Claims, 12 Drawing Sheets

Related U.S. Application Data application No. 11/431,646, filed on May 9, 2006, now Pat. No. 8,308,418.

(51) Int. Cl.
 *B65G 37/00* (2006.01)
 *B66C 19/00* (2006.01)

(56) References Cited

U.S. PATENT DOCUMENTS

| | | |
|---|---|---|
| 5,169,274 A | 12/1992 | Varga |
| 5,690,463 A | 11/1997 | Yoshie |
| 6,068,437 A | 5/2000 | Boje et al. |
| 6,086,175 A | 7/2000 | Yang |
| 6,102,647 A | 8/2000 | Yap |
| 6,183,184 B1 | 2/2001 | Shiwaku |
| 6,336,546 B1 | 1/2002 | Lorenz |
| 6,439,822 B1 | 8/2002 | Kimura et al. |
| 6,687,568 B2 | 2/2004 | Ohtsuka et al. |
| 8,308,418 B2 * | 11/2012 | Ma .................. B65G 37/02 198/347.4 |
| 2003/0235486 A1 | 12/2003 | Doherty et al. |
| 2004/0101386 A1 | 5/2004 | Robey |
| 2006/0163032 A1 | 7/2006 | Strong et al. |

* cited by examiner

HIGH EFFICIENCY BUFFER STOCKER

CROSS-REFERENCE TO RELATED APPLICATIONS

This application is a divisional application of U.S. patent application Ser. No. 13/646,755, filed on Oct. 8, 2012, which is a divisional application of U.S. patent application Ser. No. 11/431,646 filed on May 9, 2006, now U.S. Pat. No. 8,308, 418 issued on Nov. 13, 2012, the entire disclosures of which are incorporated herein by reference.

FIELD OF THE INVENTION

The present invention generally relates to overhead buffer stockers in automatic material handling systems. More particularly, the present invention relates to a high-efficiency buffer stocker which is equipped with horizontal conveyors, vertical conveyors and/or horizontal carousels to expedite transportation of products among multiple locations in a facility.

BACKGROUND OF THE INVENTION

In the manufacturing of a product, the product is usually processed at many work stations or processing machines. The transporting or conveying of partially-finished products, or work-in-process (WIP) parts, is an important aspect in the total manufacturing process. The careful conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chip must be transported between various process stations in order to facilitate various fabrication processes.

For instance, to complete the fabrication of an IC chip, various steps of deposition, cleaning, ion implantation, etching, and passivation must be carried out before an IC chip is packaged for shipment. Each of these fabrication steps must be performed in a different process machine, i.e., a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically-guided vehicles (AGVs) or overhead transport vehicles (OHTs) that travel on predetermined routes or tracks. For the conveying of semiconductor wafers, the wafers are normally loaded into cassettes or SMIF (standardized mechanical interface) pods and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle. The AGVs and OHTs normally transport the pods from bay to bay along an interbay loop, and eventually deliver the pods to a robotic storage house, or "stocker", which automatically delivers the pods to an intrabay loop.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes. For instance, as shown in FIG. 1 of the drawings, three possible configurations for utilizing a stocker are illustrated. In case A, a stocker 10 is utilized for storing WIP wafers in SMIF pods and transporting them first to tool A, then to tool B, and finally to tool C for three separate processing steps to be conducted on the wafers. After the processing in tool C is completed, the SMIF pod is returned to a stocker 10 for possible conveying to another stocker. The configuration shown in case A is theoretically workable but hardly ever possible in a fabrication environment, since the tools or processing equipment cannot always be arranged nearby to accommodate the processing of wafers in the stocker 10.

In the second configuration, case B shown in FIG. 1, a stocker 12 and a plurality of buffer stations A, B and C are used to accommodate three different processes to be conducted in tool A, tool B and tool C, respectively. As shown in FIG. 1, a SMIF pod may be first delivered to buffer station A from the stocker 12 and waits there for processing in tool A. Buffer stations B and C are similarly utilized in connection with tools B and C, respectively. The buffer stations A, B and C therefore become holding stations for conducting processes on the wafers. This configuration provides a workable solution to the fabrication process, but requires excessive floor space because of the additional buffer stations required. The configuration is therefore not feasible for use in a semiconductor fabrication facility.

In the third configuration, shown as case C in FIG. 1, a stocker 14 is provided for controlling the storage and conveying of WIP wafers to tools A, B and C. It is seen that after a SMIF pod is delivered to one of the three tools, the SMIF pod is always returned to to the stocker 14 before it is sent to the next processing tool. This is a viable process since only one stocker is required for handling three different processing tools and no buffer station is needed. The configuration shown in case C illustrates that the frequency of use of the stocker is extremely high since the stocker itself is used as a buffer station for all three tools. The accessing of the stocker 14 is therefore much more frequent than that required in the previous two configurations.

FIG. 2 illustrates a schematic of a typical automatic material handling system 20 that utilizes a central corridor 22, a plurality of bays 24 and a multiplicity of process machines 26. A multiplicity of stockers 30 are utilized for providing input/output to the bay 24, or to the processing machines 26 located on the bay 24. The central corridor 22 designed for bay layout is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation. It has been observed that a major cause for the bottlenecking at the stockers 30 is the input/output ports of the stockers.

In modern semiconductor fabrication facilities, especially for the 200 mm or 300 mm FAB plants, automatic guided vehicles (AGV) and overhead transport vehicles (OHT) are extensively used to automate the wafer transport process as much as possible. The AGV and OHT utilize the input/output ports of a stocker to load or unload wafer lots, i.e., normally stored in wafer containers such as SMIF pods or FOUPs (front opening unified pods), for example. An overhead buffer (OHB) is typically provided near each process tool for the temporary storage of wafer containers prior to entry of each container into the process tool.

FIG. 3 is a perspective view of an overhead buffer (OHB) 32 including two vehicles 34, 36 that travel on a track 38. Both an input port 40 and an output port 42 are provided on the stocker 30. Each vehicle 36 stops at the input port 40 to place a wafer container 44 in the stocker 30, while wafers (not shown) in the wafer container 44 await processing at a processing tool in the vicinity of the stocker 30. An additional vehicle 36 either places an additional wafer container 44 in the input port 40 or retrieves a wafer container 44 from the output port 42 of the stocker 30, depending on the availability of the next processing tool (not shown) in the fabrication sequence for processing of wafers contained in the wafer container 44.

One limitation of the OHB 32 is that the OHB 32 is capable of accommodating only one vehicle 34 at a time. This causes considerable bottlenecking of multiple vehicles 34 at the input side or outlet side of the stocker 30. Therefore, a high-efficiency buffer stocker is needed for absorbing and facilitating the orderly and efficient flow of multiple transport vehicles which transport wafer containers containing wafers to a stocker or from a stocker to a process tool.

SUMMARY OF THE INVENTION

The present invention is generally directed to a high-efficiency buffer stocker for absorbing the excessive flow of multiple FOUPs or other wafer containers between a processing tool and a stocker, respectively, or between a stocker and a processing tool, respectively, to facilitate the orderly and efficient flow of wafers between sequential process tools in a semiconductor fabrication facility, for example. The high-efficiency buffer stocker includes an overhead transport (OHT) track which transports multiple wafer containers such as FOUPs, for example, to a stocker or process tool and a horizontal conveyor system which receives each of multiple wafer containers from an OHT vehicle on the OHT track, transports the wafer container along a horizontal transport pathway, and returns the wafer container to the OHT vehicle on the OHT track when the OHT track is capable of receiving the additional wafer containers. Multiple levels of the horizontal conveyors may be provided for receiving wafer containers from OHT vehicles located at various points along the OHT track and returning the wafer containers to various other points along the OHT track. The invention may further include a vertical carousel for receiving each wafer container from an OHT track, transporting each wafer container in a vertical transport path and returning the wafer container to the OHT track.

BRIEF DESCRIPTION OF THE DRAWINGS

The present invention will now be described, by way of example, with reference to the accompanying drawings, in which.

DESCRIPTION OF THE PREFERRED EMBODIMENTS

The present invention has particularly beneficial utility in the handling of wafer containers such as SMIF pods and FOUPs in semiconductor fabrication facilities. However, the invention is not so limited in application and while references may be made to such semiconductor fabrication facilities, the invention is more generally applicable to the transport and handling of materials in a variety of industrial and mechanical applications.

Figure 1:
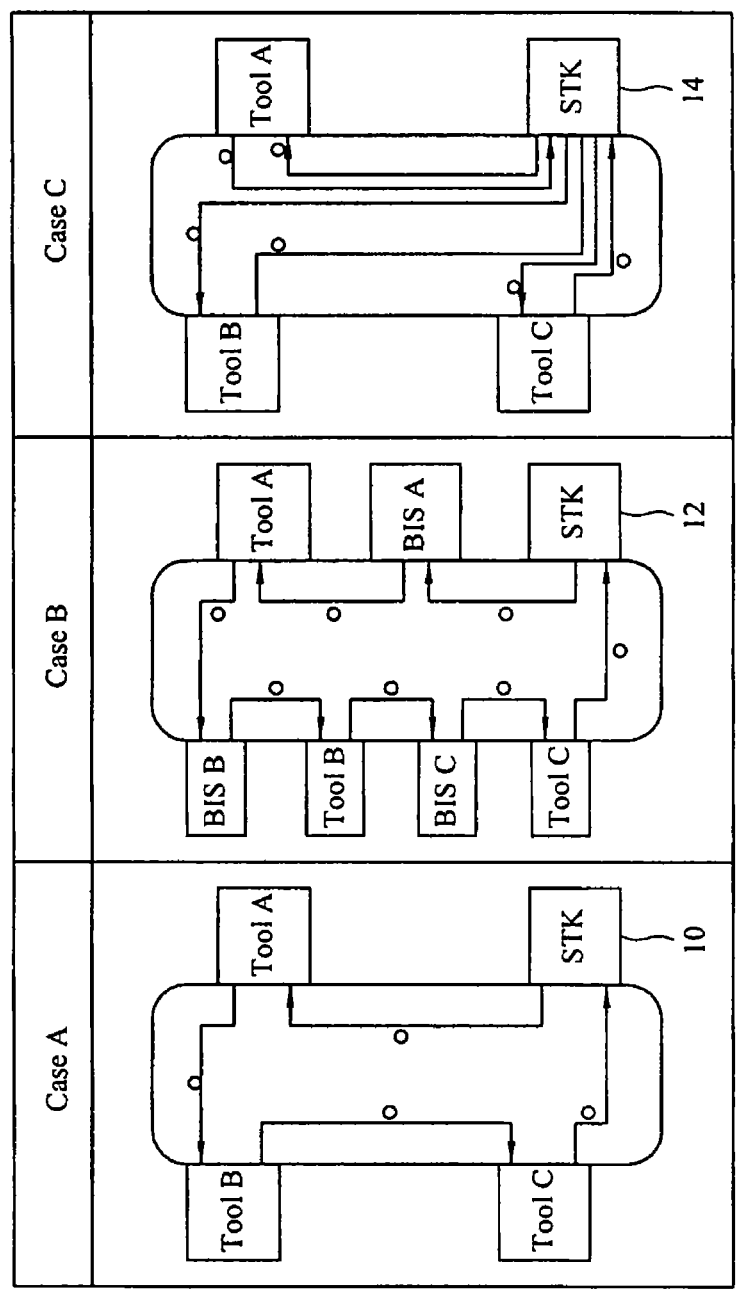
FIG. 1 is a schematic view illustrating three possible configurations for utilizing a stocker in a manufacturing facility.
Figure 2:
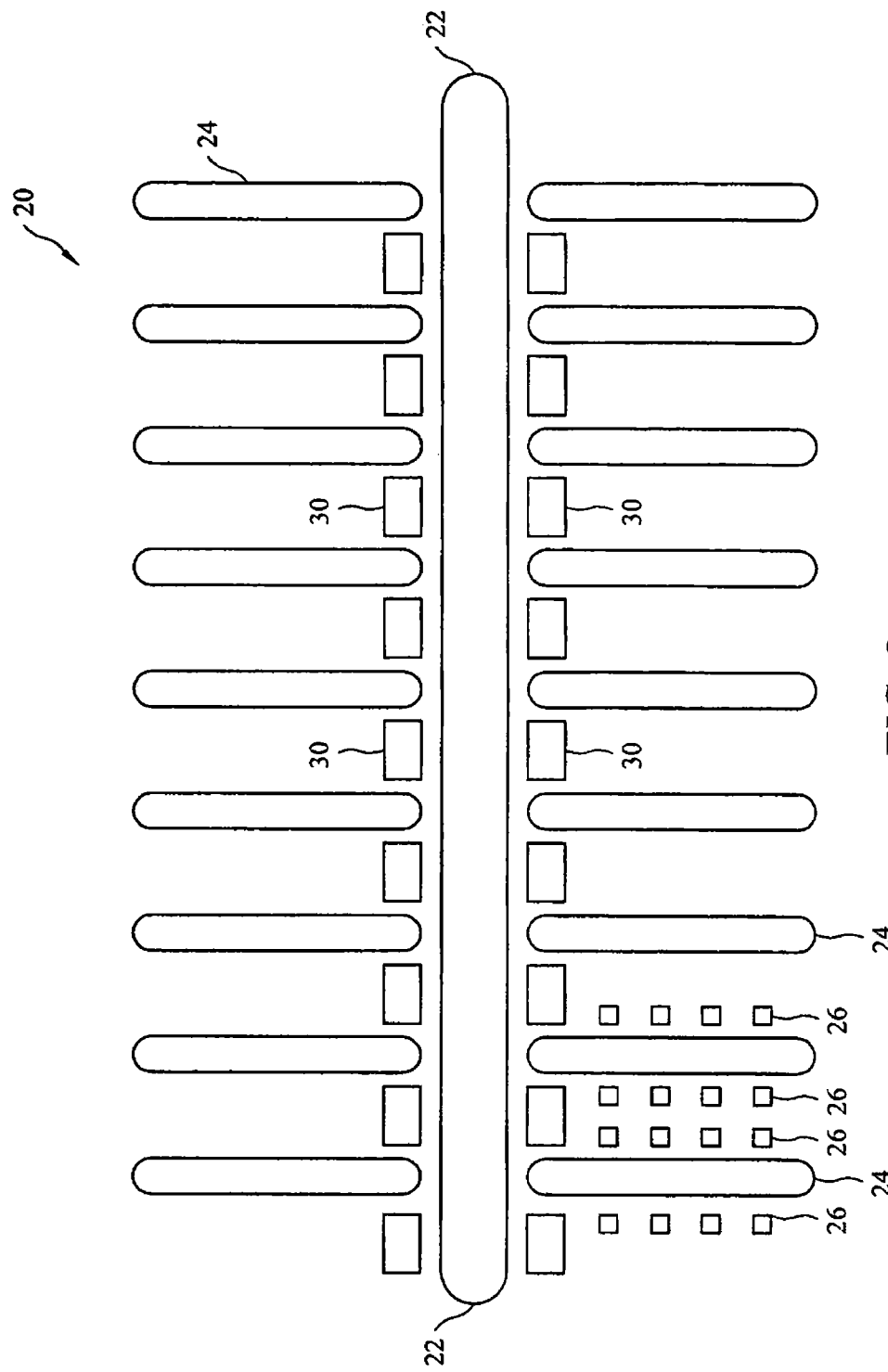
FIG. 2 is a schematic view of a typical automatic material handling system which utilizes a central corridor, a plurality of bays and a multiplicity of process machines.
Figure 3:
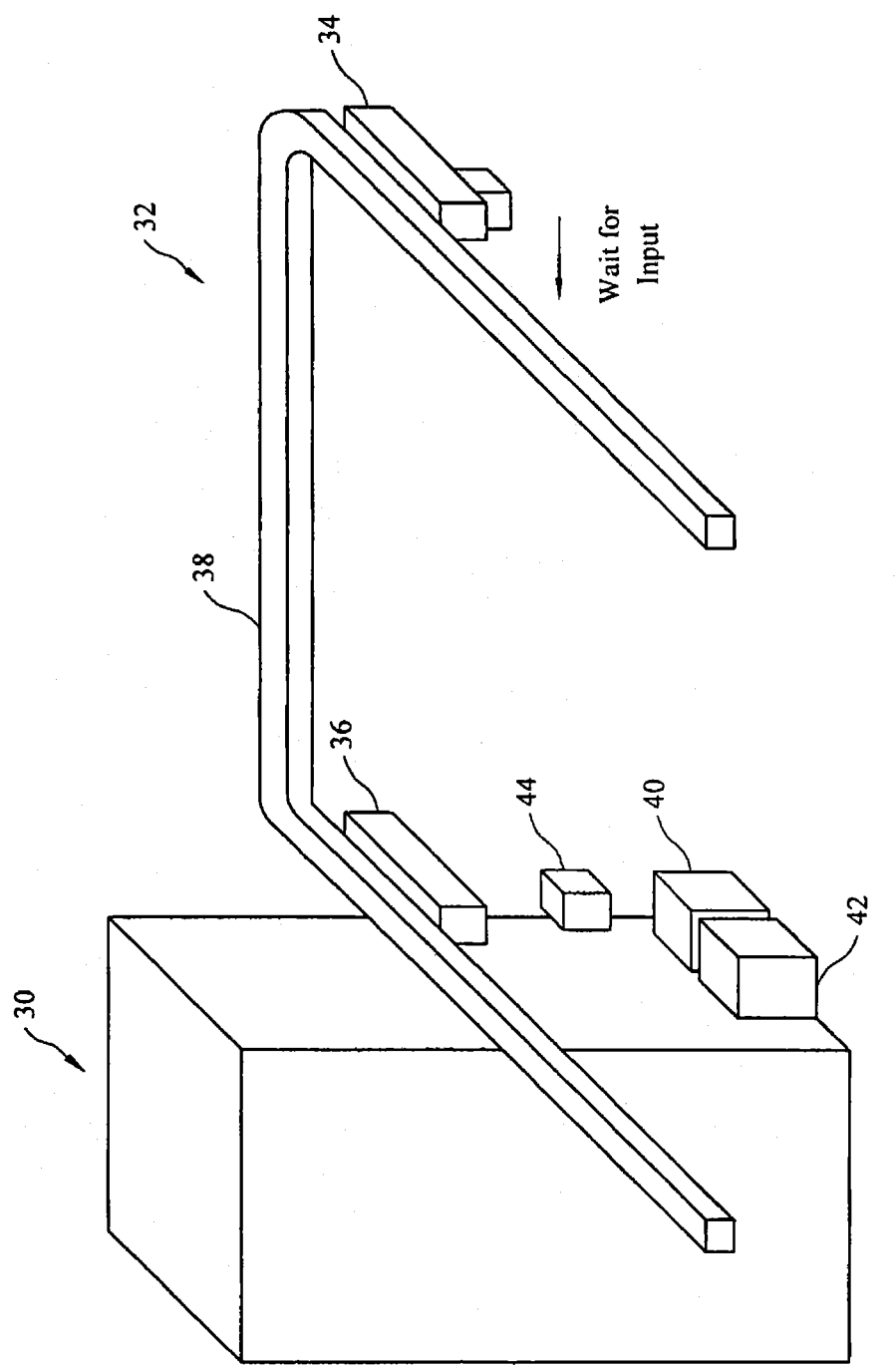
FIG. 3 is a perspective view of a conventional overhead transport vehicle (OHT) system.
Figure 4A:
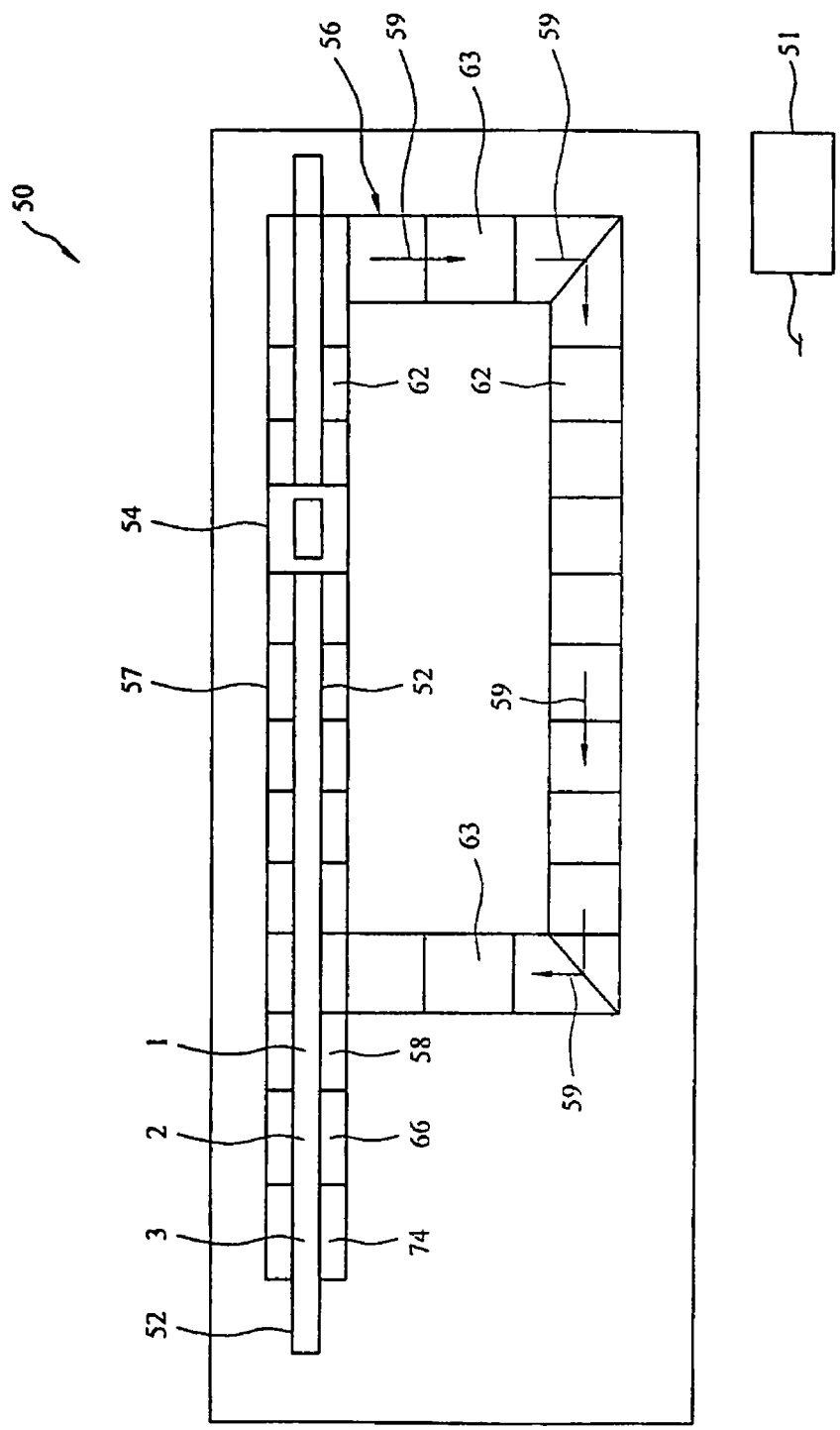
FIG. 4A is a top, partially schematic, view of a high efficiency buffer stocker according to one embodiment of the present invention.
Figure 4B:
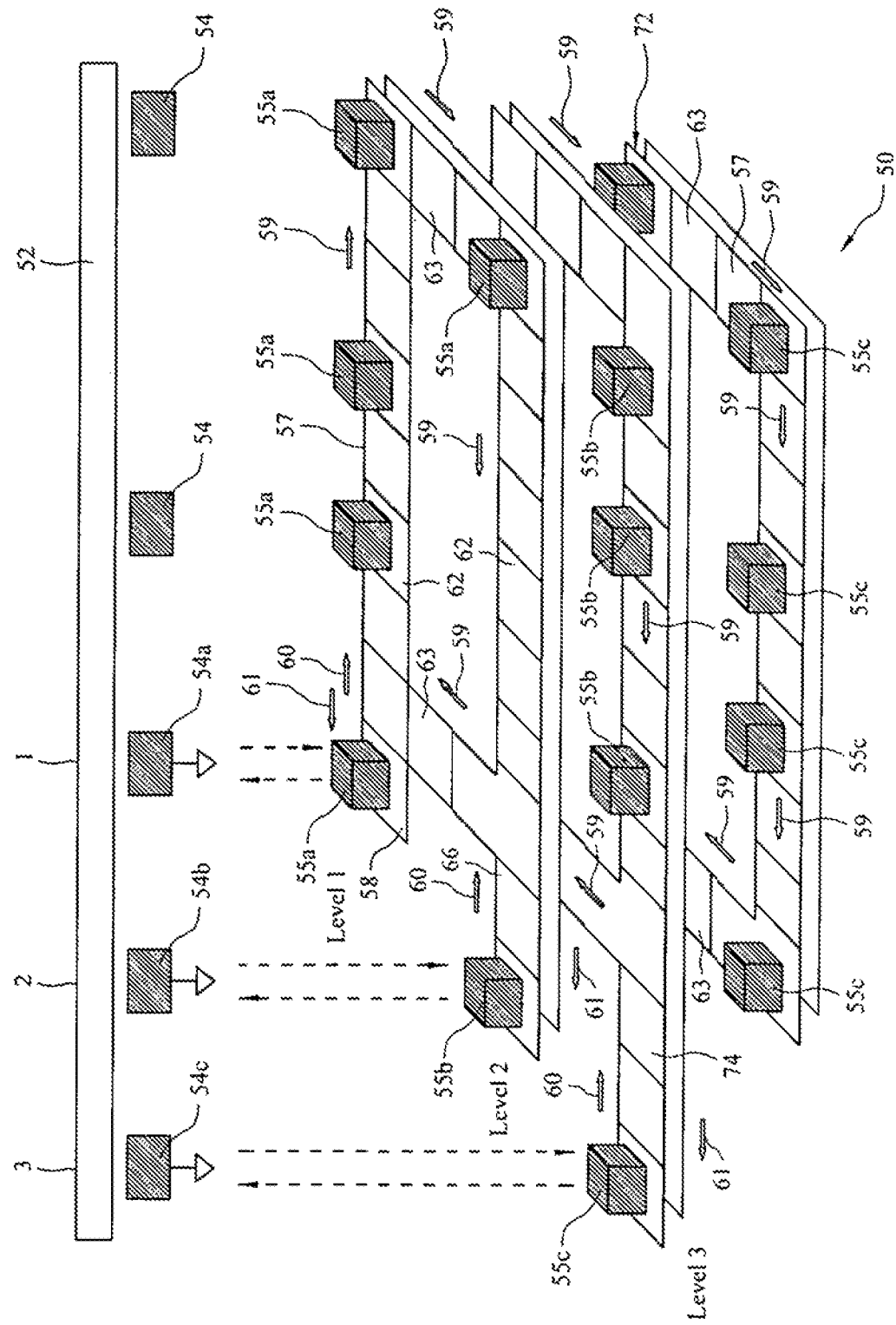
FIG. 4B is a perspective, partially schematic, view of the buffer stocker of FIG. 4A.

Referring initially to FIGS. 4A and 4B of the drawings, an illustrative embodiment of the high efficiency buffer stocker, hereinafter buffer stocker, of the present invention is generally indicated by reference numeral 50. The buffer stocker 50 includes an overhead transport (OHT) track 52. Multiple OHT vehicles 54, which may be conventional, are mounted on the OHT track 52 for transport between process tools (not shown) or between a process tool and a conventional stocker (not shown) in a semiconductor fabrication facility, for example. Each OHT vehicle 54 is capable of carrying a wafer container 55, such as a SMIF pod or FOUP, for example, which contains multiple wafers on which integrated circuits are being fabricated.

The buffer stocker 50 further includes an upper-level conveyor system 56, a mid-level conveyor system 64 beneath the upper level conveyor system 56, and a lower-level conveyor system 72 beneath the mid-level conveyor system 64. The upper-level conveyor system 56, mid-level conveyor system 64 and lower-level conveyor system 72 each typically includes a typically rectangular conveyor belt loop 57 having a pair of parallel longitudinal conveyor belts 62 and a pair of parallel transverse conveyor belts 63 disposed at respective ends of the longitudinal conveyor belts 62. The upper-level conveyor system 56 includes a load/unload conveyor belt 58 which receives wafer containers 55a from OHT vehicles 54a that stop at a first position 1 on the OHT track 52. The load/unload conveyor belt 58 transfers the wafer containers 55a onto the conveyor belt loop 57 of the upper-level conveyor system 56. The mid-level conveyor system 64 includes a load/unload conveyor belt 66 which receives wafer containers 55b from OHT vehicles 54b that stop at a second position 2 on the OHT track 52. The load/unload conveyor belt 74 transfers the wafer containers 55b onto the conveyor belt loop 57 of the mid-level conveyor system 64. The lower-level conveyor system 72 includes a load/unload conveyor belt 74 which receives wafer containers 55c from OHT vehicles 54c that stop at a third position 3 on the OHT track 52. The load/unload conveyor belt 74 transfers the wafer containers 55c onto the conveyor belt loop 57 of the lower-level conveyor system 72. As shown in FIG. 4A, the load/unload belt 58 of the upper level conveyor system 56, the load/unload belt 66 of the mid-level conveyor system 64 and the load/unload belt 74 of the lower-level conveyor system 72 are located beneath the first, second and third positions 1, 2 and 3, respectively, on the OHT track 52. As shown in FIG. 4A, a controller 51 is operably connected to the upper level conveyor system 56, the mid-level conveyor system 64 and the lower-level conveyor system 72 for controlling the travel direction of each conveyor belt loop 57.

In typical operation of the buffer stocker 50, the OHT vehicles 54, each of which carries a wafer container 55 containing wafers (not shown) on which integrated circuits are being fabricated, travel in either direction along the OHT track 52. The OHT vehicles 54 typically transport the wafer containers 55 from a process tool (not shown) to a conventional stocker (not shown), or alternatively, from a conventional stocker to a downstream process tool. However, the conventional stocker is often filled to capacity with the wafer containers 55 or the process tool is often not available to receive an additional wafer container 55 for processing of the wafers therein. Therefore, bottlenecking of the OHT vehicles 54 on the OHT track 52 often occurs in the vicinity of the conventional stocker or process tool.

Accordingly, as shown in FIG. 4B, as the OHT vehicles 54 travel along the OHT track 52, when one of the OHT vehicles 54a reaches the first position 1 on the OHT track 52, the wafer container 55a being carried by the OHT vehicle 54a can be lowered onto the load/unload conveyor belt 58 of the upper level conveyor system 56. The load/unload conveyor belt 58 transports the wafer container 55a to the conveyor belt loop 57 of the upper level conveyor system 56, as indicated by the load arrow 60. The conveyor belt loop 57 carries the wafer container 55a along a transport pathway 59. Meanwhile, the unloaded OHT vehicle 54a continues to move along the OHT track 52 to an alternative destination in the semiconductor fabrication facility to pick up and transport another wafer container 55 in the facility, for example. Multiple OHT vehicles 54a, each of which carries a wafer container 55a, may sequentially stop at the first position 1 to unload a wafer container 55a onto the load/unload conveyor belt 58, in similar fashion. Accordingly, multiple wafer containers 55a may circulate simultaneously on the conveyor belt loop 57 of the upper level conveyor system 56.

When space in the conventional stocker (not shown) becomes available for the storage of wafer containers 55, or when the process tool becomes available for the processing of wafers in a wafer container 55, one of the wafer containers 55a being transported by the upper level conveyor system 56 can be transported from the conveyor belt loop 57 back onto the load/unload belt 58, as indicated by the unload arrow 61, by reverse operation of the load/unload conveyor belt 58. The wafer container 55a is then uploaded from the load/unload conveyor belt 58 and onto a vacant OHT vehicle 54a which is stopped at the first position 1 on the OHT track 52. The OHT vehicle 54a then carries the loaded wafer container 55a to the conventional stocker, where the wafer container 55a is stored, or to the process tool, where the wafers in the wafer container 55a are processed.

As further shown in FIG. 4B, in the event that the upper level conveyor system 56 becomes filled to capacity with wafer containers 55a, additional OHT vehicles 54b can stop at the second position 2 on the OHT track 52 to unload wafer containers 55b onto the load/unload conveyor belt 66 of the mid-level conveyor system 57. The load/unload conveyor belt 66 transports each wafer container 55b onto the conveyor belt loop 57 of the mid-level conveyor system 64, as indicated by the load arrow 60. The wafer containers 55b are transported by the mid-level conveyor system 64 along the transport pathway 59, until the conventional stocker or process tool becomes available to receive a wafer container 55b. At that time, one of the wafer containers 55b is transported from the conveyor belt loop 57 back onto the load/unload conveyor belt 66 and the wafer container 55b is uploaded from the load/unload conveyor belt 66 to a vacant OHT vehicle 54b stopped at the second position 2 on the OHT track 52. The OHT vehicle 54b then transports the wafer container 55b to the conventional stocker or process tool.

As further shown in FIG. 4B, when the upper level conveyor system 56 and mid-level conveyor system 64 have both become filled to capacity with wafer containers 55a and 55b, respectively, additional OHT vehicles 54c can be stopped at the third position 3 on the OHT track 52. A wafer container 55c is loaded from each OHT vehicle 54c onto the load/unload conveyor belt 74 of the lower level conveyor system 72. The lower level conveyor system 72 transports the wafer containers 55c along the transport pathway 59 until the conventional stocker or process tool becomes available to receive a wafer container 55c. A vacant OHT vehicle 54c stops at the third position 3 on the OHT track 52, and one of the wafer containers 55c is transported from the conveyor belt loop 57 back onto the load/unload conveyor belt 74. The wafer container 55c is uploaded from the load/unload conveyor belt 74 to the OHT vehicle 54c, which then transports the wafer container 55c to the conventional stocker or process tool.

Figure 5A:
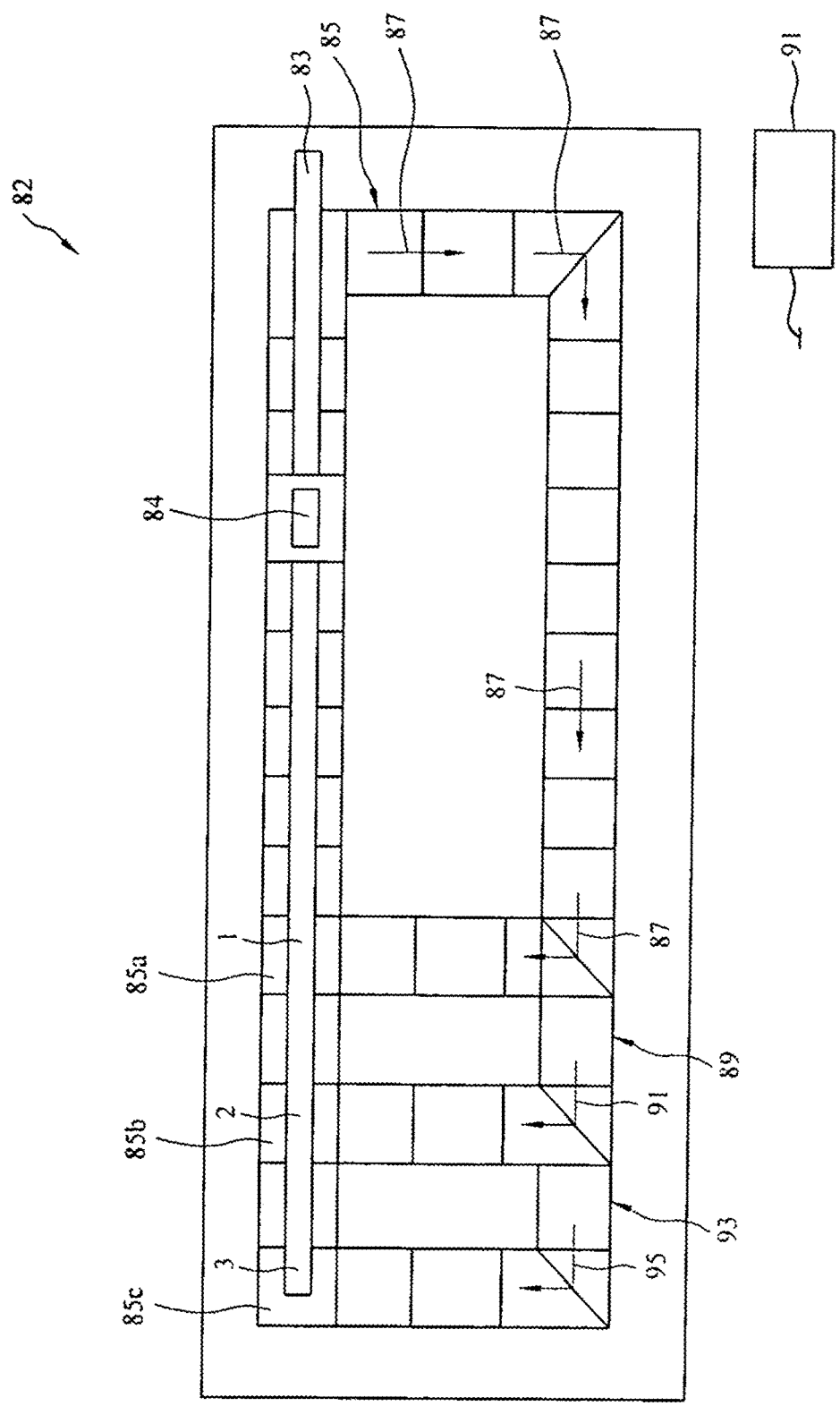
FIG. 5A is a top, partially schematic, view of a high efficiency buffer stocker according to another embodiment of the present invention.
Figure 5B:
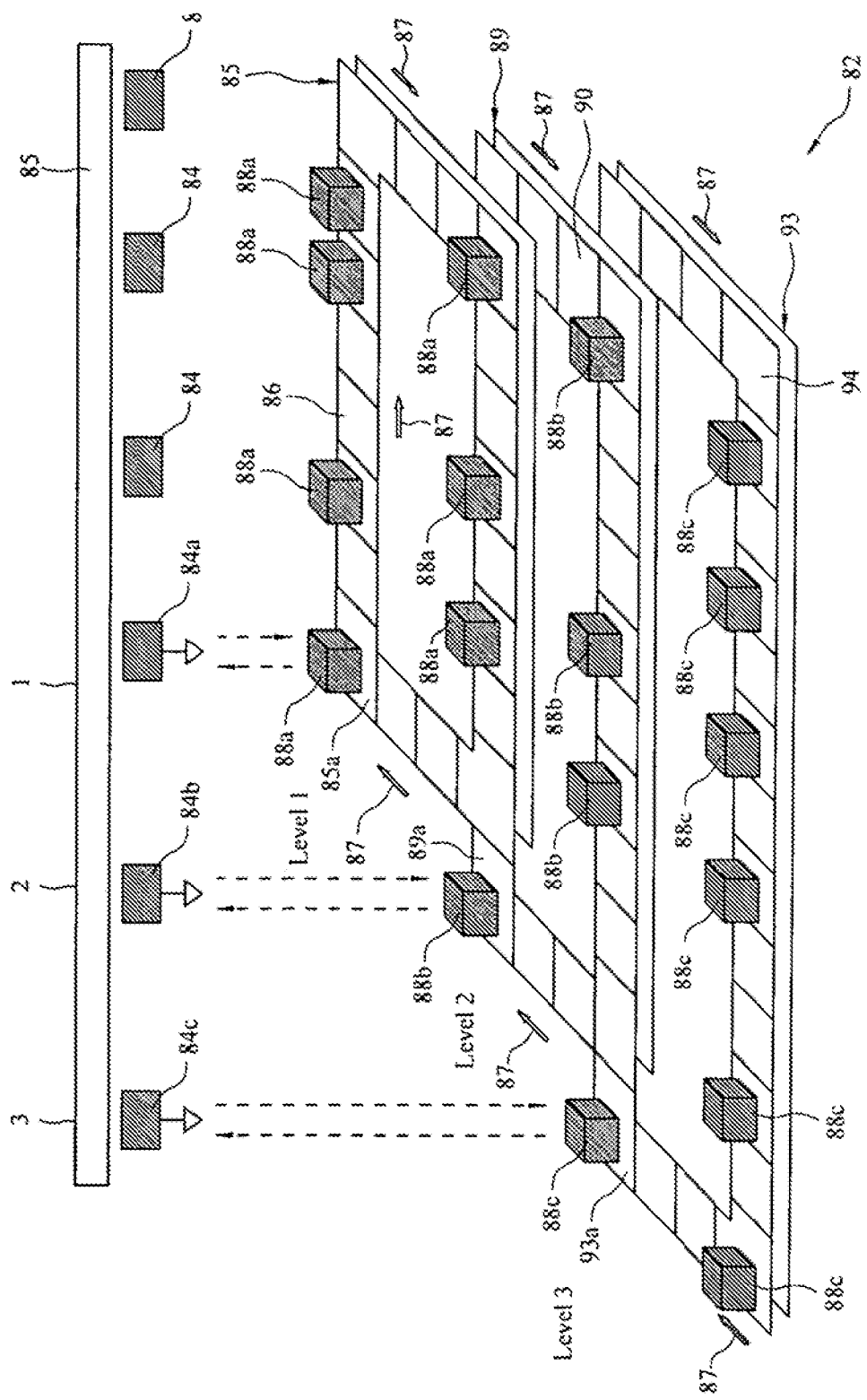
FIG. 5B is a perspective, partially schematic, view of the buffer stocker of FIG. 5A.

Referring next to FIGS. 5A and 5B, another embodiment of the buffer stocker is generally indicated by reference numeral 82 and includes an OHT track 83 on which multiple OHT vehicles 84 are mounted for travel. Each of the OHT vehicles 84 carries a wafer container 88 for transport of the wafer container 88 between process tools or between a process tool and a stocker. The buffer stocker 82 further includes an upper level conveyor system 85 having a conveyor belt loop 86 which is typically rectangular in configuration. A lower level conveyor system 93 having a conveyor belt loop 94 is disposed beneath the upper level conveyor system 85. A mid-level conveyor system 89 having a conveyor belt loop 90 may be provided between the lower level conveyor system 93 and the upper level conveyor system 85. The upper level conveyor system 85 includes a load point 85a which is located beneath a first position 1 on the OHT track 83, the mid-level conveyor system 89 includes a load point 89a which is located beneath a second position 2 on the OHT track 83, and the lower level conveyor system 93 includes a load point 93a which is located beneath a third position 3 on the OHT track 83. As shown in FIG. 5A, a controller 91 is operably connected to the upper level conveyor system 85, the mid-level conveyor system 89 and the lower-level conveyor system 93 for controlling the travel direction of the respective conveyor belt loops 86, 90, 94.

The buffer stocker 82 is typically operated when a conventional stocker (not shown) serviced by the OHT track 83 becomes filled to capacity with the wafer containers 84 or when a process tool (not shown) serviced by the OHT track 83 is not available to receive an additional wafer container 84 for processing of the wafers therein. Accordingly, OHT vehicles 84a are stopped at a first position 1 on the OHT track 83 and wafer containers 88a are unloaded from the OHT vehicles 84a onto the load point 85a of the upper level conveyor system 85. The wafer containers 88a are transported by the upper level conveyor system 85 along a transport pathway 87, until one or more of the wafer containers 88a can be transported to the conventional stocker or process tool. Accordingly, each wafer container 88a is loaded from the load point 85a onto a vacant OHT vehicle 84a stopped at the first position 1 on the OHT track 83. The OHT vehicle 84a then transports the wafer container 88a to the conventional stocker or to the process tool.

In the event that the upper level conveyor system 85 becomes filled to capacity with the wafer containers 88a, additional wafer containers 88b can be loaded from OHT vehicles 84b stopped at the second position 2 on the OHT track 83 and onto the load point 89a of the conveyor belt loop 90, and transported on the mid-level conveyor system 89. In like manner, in the event that the mid-level conveyor system 89 becomes filled to capacity with the wafer containers 88b, additional wafer containers 88c can be loaded from OHT vehicles 84c stopped at the third position 3 on the OHT track 83 and onto the load point 93a of the conveyor belt loop 94, and transported on the lower level conveyor system 93. When the conventional stocker or process tool becomes available for receiving wafer containers 84, one or multiple wafer containers 88b can be loaded from the load point 89a of the mid-level conveyor system 89 and onto an OHT vehicle or vehicles 84b stopped at the second position 2 on the OHT track 83 and transported to the conventional stocker or process tool. Likewise, one or multiple wafer containers 88c can be loaded from the load point 93a of the lower level conveyor system 93 and onto an OHT vehicle or vehicles 84c stopped at the third position 3 on the OHT track 83 for transport to the conventional stocker or process tool.

Figure 6A:
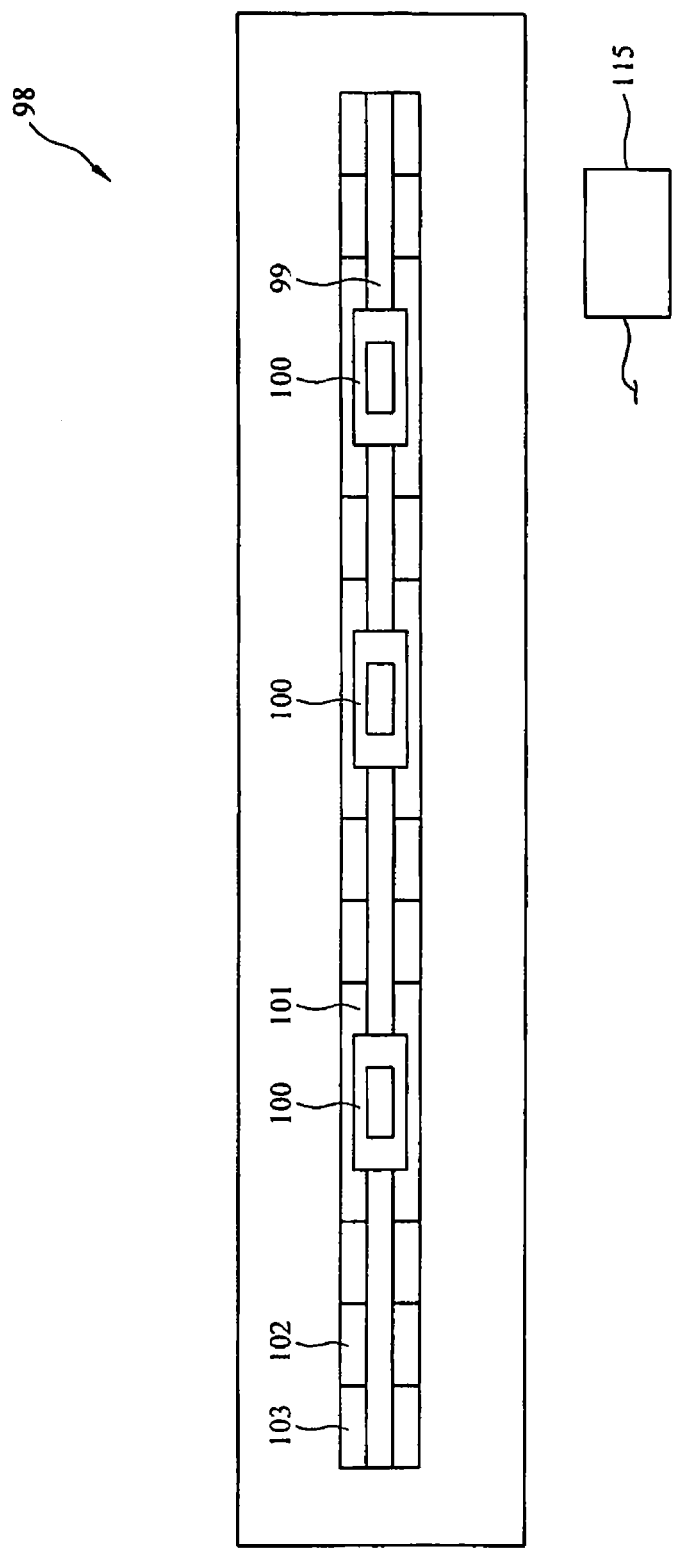
FIG. 6A is a top, partially schematic, view of a high efficiency buffer stocker according to still another embodiment of the present invention.
Figure 6B:
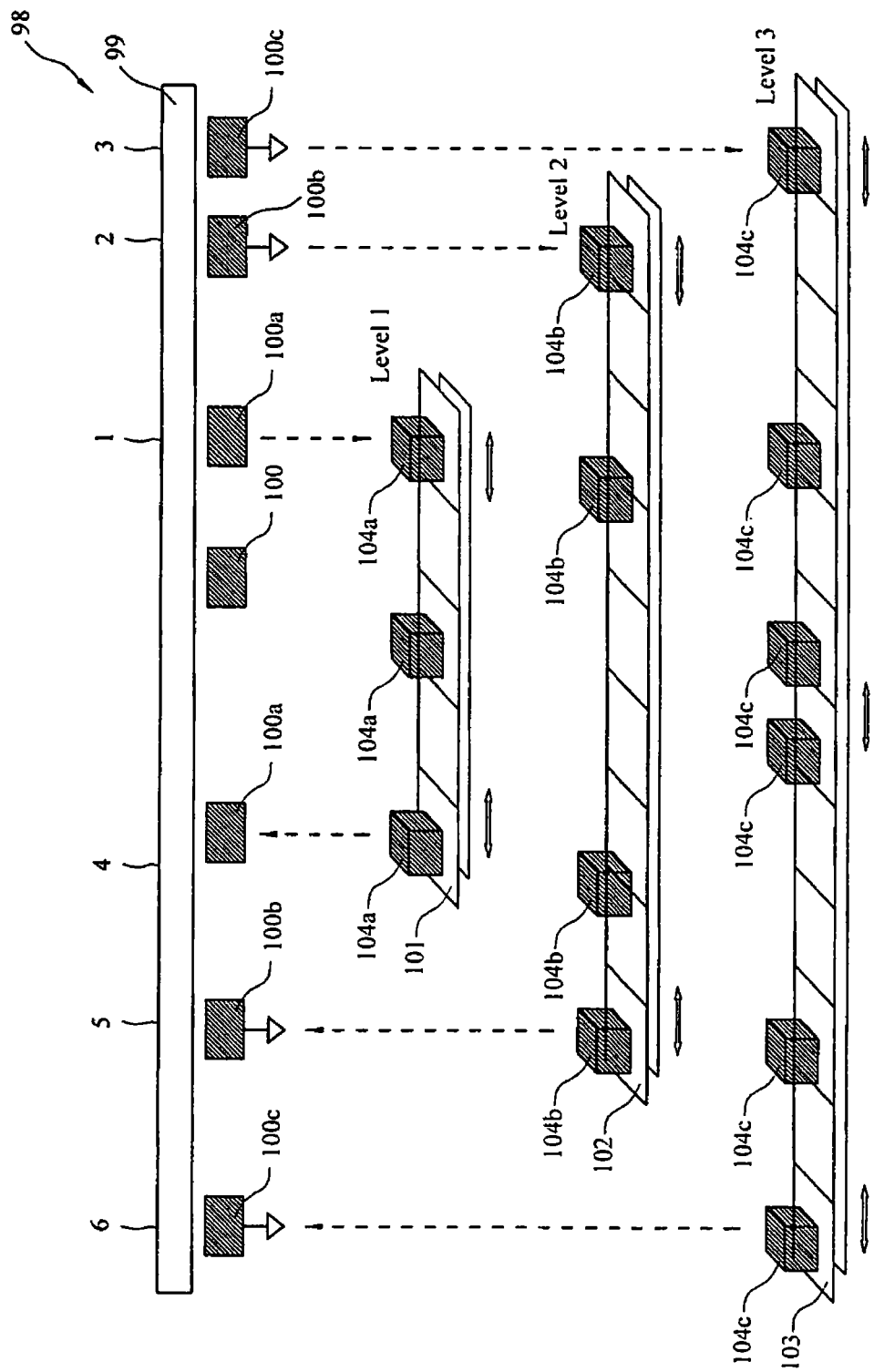
FIG. 6B is a perspective, partially schematic, view of the buffer stocker of FIG. 6A.

Referring next to FIGS. 6A and 6B, in still another embodiment of the invention the buffer stocker is generally indicated by reference numeral 98. The buffer stocker 98 includes an OHT track 99 for transport of OHT vehicles 100, each of which carries a wafer-containing wafer container 104, between process tools (not shown) or between a process tool and a conventional stocker (not shown). The buffer stocker 98 further includes an upper-level conveyor belt 101, a lower-level conveyor belt 103 and a mid-level conveyor belt 102 between the lower-level conveyor belt 103 and the upper-level conveyor belt 101. As shown in FIG. 6A, a controller 115 is typically operably connected to the upper level conveyor belt 101, the mid-level conveyor belt 102 and the lower-level conveyor belt 103 for controlling the travel direction of each.

In operation of the buffer stocker 98, multiple OHT vehicles 100 travel on the OHT track 99, and each carries a wafer container 104 between process tools (not shown) or between a process tool and a conventional stocker (not shown). In the event that the conventional stocker or process tool is filled to capacity, an OHT vehicle 100a can be stopped at a first position 1 on the OHT track 99. A wafer container 104a is then lowered from the OHT vehicle 100a onto one end of the upper-level conveyor belt 101, which transports the wafer container 104a to the opposite end of the upper-level conveyor belt 101. When the conventional stocker or process tool becomes available to receive wafer containers 104a, the wafer container 104a can be loaded from the upper level conveyor belt 101 onto a vacant OHT vehicle 100a stopped at a fourth position 4 on the OHT track 99. The OHT vehicle 100a then transports the wafer container 104a to the conventional stocker or process tool.

In the event that the upper level conveyor belt 101 becomes loaded to capacity with wafer containers 104a, an OHT vehicle 100b can be stopped at a second position 2 on the OHT track 99 to unload a wafer container 104b onto one end of the mid-level conveyor belt 102. The mid-level conveyor belt 102 then transports the wafer container 104b to the opposite end of the mid-level conveyor belt 102, from which a vacant OHT vehicle 100b stopped at a fifth position 5 on the OHT track 99 can receive the wafer container 104b when the conventional stocker or process tool becomes available to receive the wafer container 104b.

In the event that the mid-level conveyor belt 102 becomes loaded to capacity with wafer containers 104b, an OHT vehicle 100c can be stopped at a third position 3 on the OHT track 99 to unload a wafer container 104c onto one end of the lower level conveyor belt 103. The lower level conveyor belt 103 then transports the wafer container 104c to the opposite end of the lower level conveyor belt 103. A vacant OHT vehicle 100c stopped at a sixth position 6 on the OHT track 99 is in position to receive the wafer container 104c when the conventional stocker or process tool becomes available to receive the wafer container 104c. It will be appreciated by those skilled in the art that, by operation of the controller 115, the direction of travel of the upper-level conveyor belt 101, the mid-level conveyor belt 102 and the lower level conveyor belt 103 can be selected depending on the direction of travel of the OHT vehicles 100 on the OHT track 99.

Figure 7A:
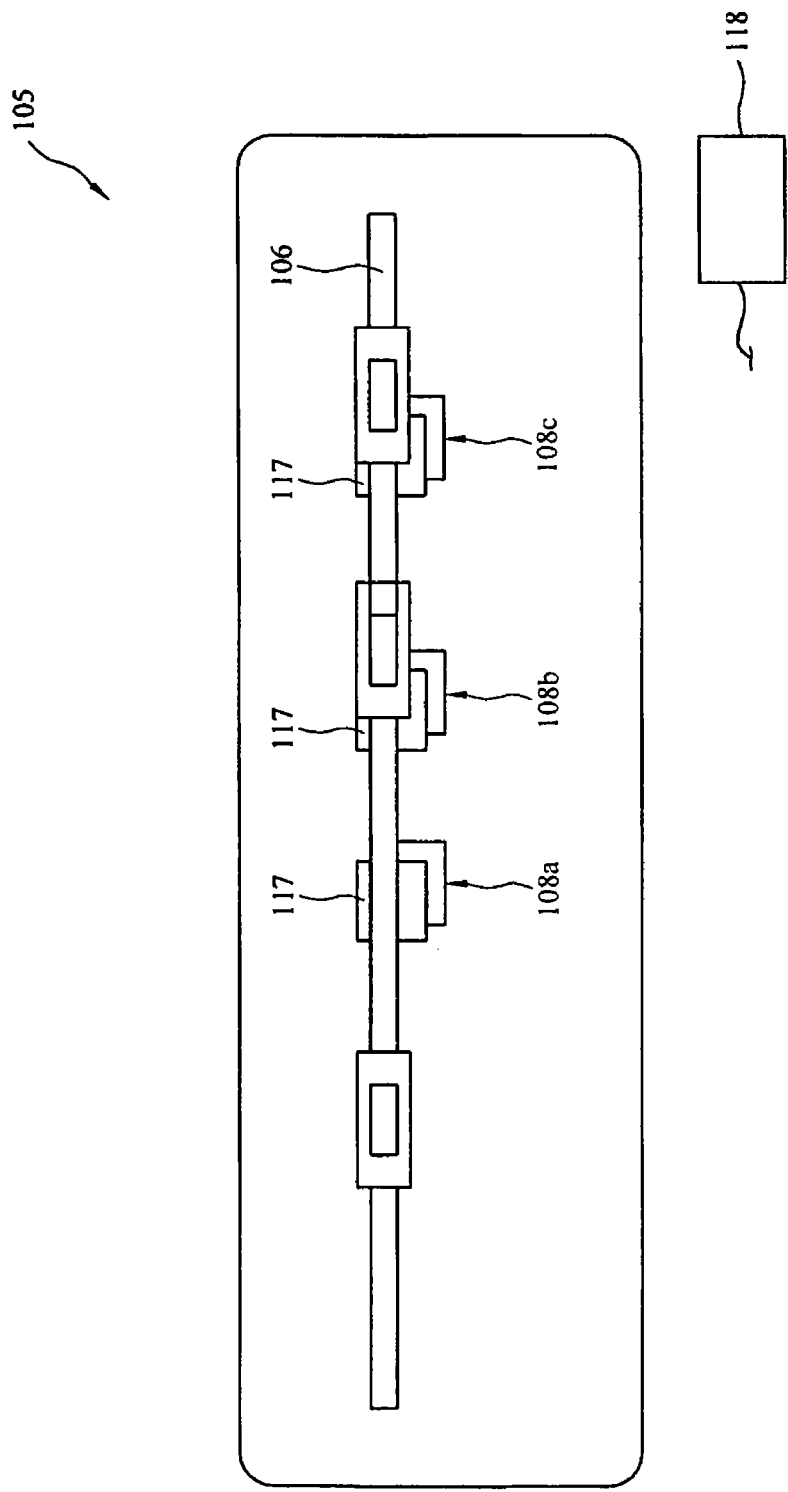
FIG. 7A is a top, partially schematic, view of a high efficiency buffer stocker according to yet another embodiment of the present invention.
Figure 7B:
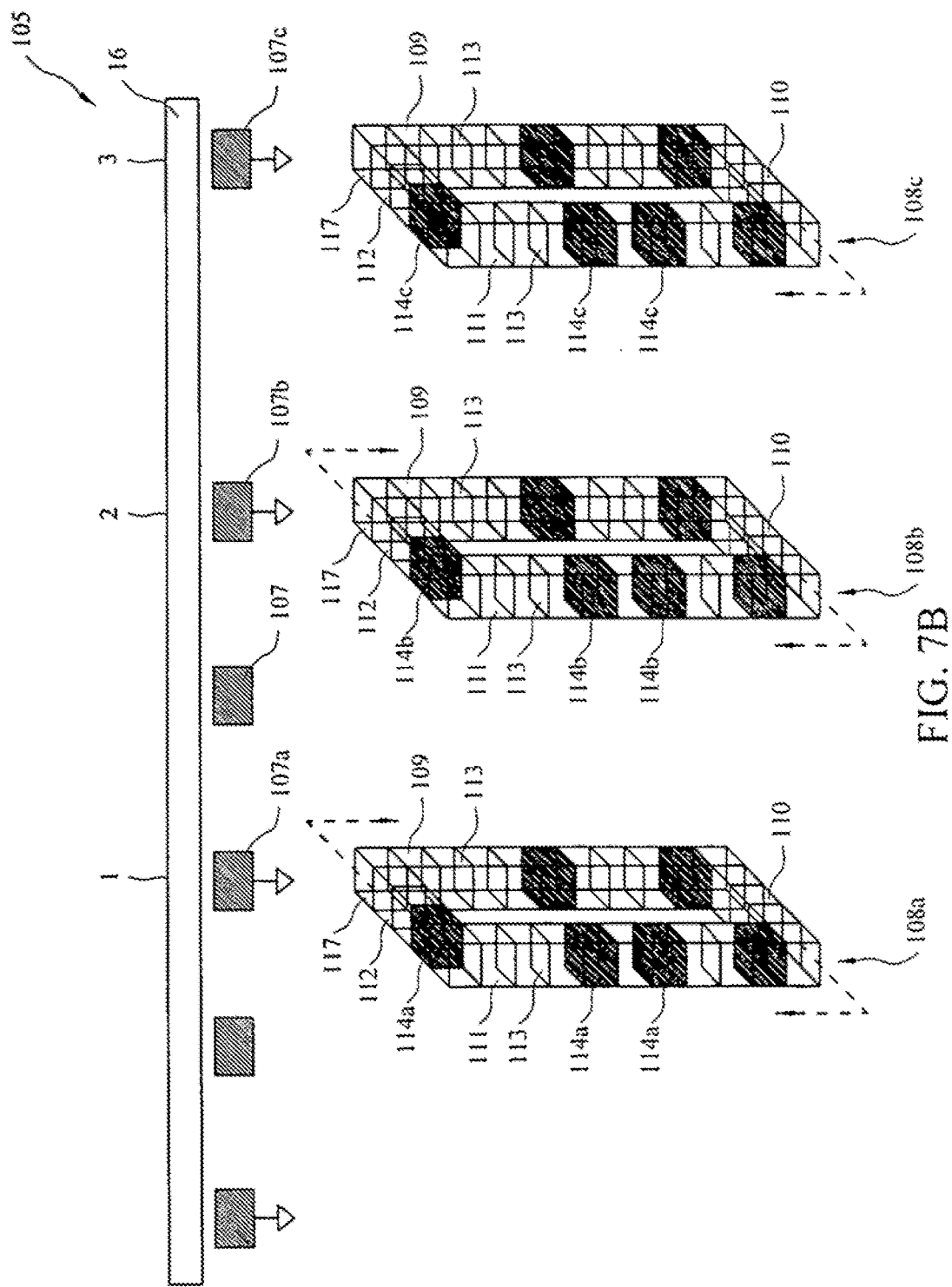
FIG. 7B is a perspective, partially schematic, view of the buffer stocker of FIG. 7A.
Figure 7C:
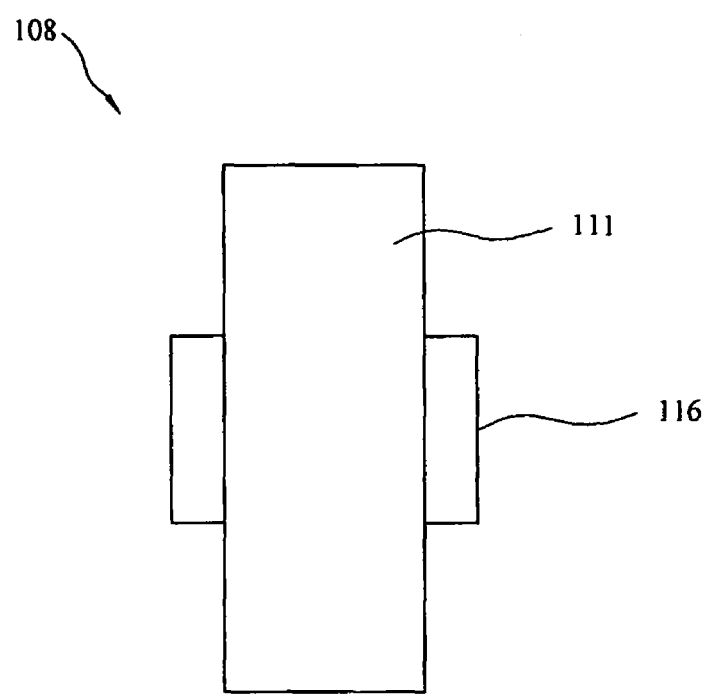
FIG. 7C is a side view of a carousel according to the embodiment of FIGS. 7A and 7B.

Referring next to FIGS. 7A-7C, yet another embodiment of the overhead buffer stocker is generally indicated by reference numeral 105. The buffer stocker 105 includes an OHT track 106 on which multiple OHT vehicles 107, each of which carries a wafer container 114, are mounted for travel between process tools (not shown) or between a process tool and a conventional stocker (not shown). At least one, and preferably, multiple carousels 108 are provided beneath the OHT track 106. The carousels 108 are designated in FIGS. 7A and 7B as a first carousel 108a, a second carousel 108b and a third carousel 108c. Each carousel 108 typically includes a descending conduit 109, a bottom transverse conduit 110, an ascending conduit 111 and a top transverse conduit 112. Multiple container support platforms 113 are mounted in the descending conduit 109, bottom transverse conduit 110, ascending conduit 111 and top transverse conduit 112. A motor 116 (FIG. 7C) operably engages each of the container support platforms 113 for moving the container support platforms 113 throughout the carousel 108, as indicated by the dashed arrows. A container opening 117 is provided in each top transverse conduit 112 for receiving a wafer container 114a into the carousel 108, as hereinafter further described. As shown in FIG. 7A, the container opening 117 of each carousel 108 is located beneath the OHT track 106. As shown in FIG. 7A, a controller 118 may be operably connected to the first carousel 108a, the second carousel 108b and the third carousel 108c for controlling the travel direction of each.

In operation of the buffer stocker 105, each of the OHT vehicles 107 carries a wafer container 114 between process tools or between a process tool and a conventional stocker. In the event that the conventional stocker or process tool becomes filled to capacity, OHT vehicles 107a can be stopped at a first position 1 on the OHT track 106. Wafer containers 114a are unloaded from the OHT vehicles 107a, through the container opening 117 and onto one of the container support platforms 113 in the first carousel 108a. The container support platforms 113 are capable of transporting the wafer containers 114a through the first carousel 108a to position vacant container support platforms 113 beneath the container opening 117 to receive additional wafer containers 114a. After the first carousel 108a has become filled to capacity with wafer containers 114a, additional OHT vehicles 107b can be stopped at a second position 2 on the OHT track 106. Wafer containers 114b can then be unloaded from each wafer container 114b and into the second carousel 108b through the container opening 117. In the event that the second carousel 108b becomes filled to capacity with wafer containers 114b, additional wafer containers 114c can be loaded into the third carousel 108c from OHT vehicles 107c stopped at a third position 3 on the OHT track 106.

When the process tool or conventional stocker becomes available for receiving wafer containers 114, a wafer container 114a can be unloaded from the first carousel 108a through the container opening 117 and back onto a vacant OHT vehicle 107a stopped at the first position 1 for transport of the wafer container 114a to the process tool or conventional stocker. In the same manner, the wafer containers 114b can be unloaded from the second carousel 108b onto vacant OHT vehicles 107b stopped at the second position 2, and the wafer containers 114c can be unloaded from the third carousel 108c onto vacant OHT vehicles 107c stopped at the third position 3.

While the preferred embodiments of the invention have been described above, it will be recognized and understood that various modifications may be made in the invention and the appended claims are intended to cover all such modifications which may fall within the spirit and scope of the invention.

What is claimed is:

1. A buffer stocker system comprising:
    an overhead transport track supporting a plurality of moveable overhead transport vehicles each configured for carrying a container, the overhead transport track comprising at least a first position and a second position;
    a first elongated conveyor belt at a first elevation having a first end and a second end, the first end corresponding to the first position of the overhead transport track; and
    a second elongated conveyor belt at a second elevation having a first end and a second end, the first end corresponding to the second position of the overhead transport track, wherein the second elongated conveyor belt is positioned vertically directly beneath the first elongated conveyor belt, wherein the first elongated conveyor belt and the second elongated conveyor belt are overlapping in plan view,
    wherein the first end of the second elongated conveyor belt extends longitudinally beyond the first end of the first elongated conveyor belt, and
    wherein the first elongated conveyor belt and the second elongated conveyor belt are each configured to receive a container from one of the plurality of moveable overhead transport vehicles at respective first or second positions.

2. The buffer stocker of claim 1, wherein the overhead transport track comprises at least a third position corresponding to the second end of the first elongated conveyor belt, wherein the first elongated conveyor belt is configured to transport the container received at the first end to the second end, and wherein the moveable overhead transport vehicles are configured to retrieve the container from the third position.

3. The buffer stocker of claim 2, wherein the overhead transport track comprises at least a fourth position corresponding to the second end of the second elongated conveyor belt, wherein the second elongated conveyor belt is configured to transport the container received at the first end to the second end, wherein the second end of the second elongated conveyor belt extends longitudinally beyond the second end of the first elongated conveyor belt, and wherein the moveable overhead transport vehicles are configured to retrieve the container from the fourth position.

4. The buffer stocker of claim 3, comprising a third conveyor belt at a third elevation having a first end and a second end, wherein the overhead transport track comprises a fifth position corresponding to the first end of the third conveyor belt,
    wherein the third conveyor belt is positioned vertically directly beneath the second elongated conveyor belt,
    wherein the first end of the third conveyor belt extends longitudinally beyond the first end of the second elongated conveyor belt,
    wherein the third conveyor belt is configured to receive a container from one of the plurality of moveable overhead transport vehicles at the fifth position, and
    wherein the first elongated conveyor belt, the second elongated conveyor belt, and the third conveyor belt are overlapping in plan view.

5. The buffer stocker of claim 4, wherein the overhead transport track comprises a sixth position corresponding to the second end of the third conveyor belt, wherein the third conveyor belt is configured to transport the container received at the first end to the second end, wherein the second end of the third conveyor belt extends longitudinally beyond the second end of the second elongated conveyor belt, and wherein the moveable overhead transport vehicles are configured to retrieve the container from the sixth position.

6. The buffer stocker of claim 5, wherein the moveable overhead transport vehicles are configured to sequentially stop at each of the first, second, third, fourth, fifth, and sixth track points.

7. The buffer stocker of claim 6, wherein the transport vehicles are configured to load the first elongated conveyor belt to capacity before loading the second elongated conveyor belt.

8. The buffer stocker of claim 1, comprising a controller operably connected to the first and second elongated conveyor belts and configured to control a direction of travel of the first and second elongated conveyor belts.

9. The buffer stocker of claim 1, wherein the container to be transferred is configured to contain a wafer.

10. A buffer stocker system comprising:
    a longitudinally-extending transport track adapted to move a plurality of transport vehicles horizontally along the transport track, the plurality of transport vehicles being configured for carrying, lowering, and raising containers, wherein the longitudinally-extending transport track comprises at least a first position and a second position; and
    a plurality of conveyor systems associated with the transport track for temporarily storing the containers, the plurality of conveyor systems each comprising:
        a first elongated conveyor belt having a first end and a second end, the first end corresponding to the first position of the overhead transport track; and a second elongated conveyor belt having a first end and a second end, the first end corresponding to the second position of the overhead transport track, wherein the second elongated conveyor belt is positioned vertically directly beneath the first elongated conveyor belt, wherein the first end of the second elongated conveyor belt extends longitudinally beyond the first end of the first elongated conveyor belt, wherein the first elongated conveyor belt and the second elongated conveyor belt are overlapping in plan view, and wherein the first elongated conveyor belt and the second elongated conveyor belt are each configured to receive a container from one of the plurality of transport vehicles at respective first or second positions.

11. The buffer stocker of claim 10, wherein the transport track comprises at least a third position corresponding to the second end of the first elongated conveyor belt, wherein the first elongated conveyor belt is configured to transport the container received at the first end to the second end, and wherein the transport vehicles are configured to retrieve the container from the third position.

12. The buffer stocker of claim 11, wherein the transport track comprises at least a fourth position corresponding to the second end of the second elongated conveyor belt, wherein the second elongated conveyor belt is configured to transport the container received at the first end to the second end, and wherein the transport vehicles are configured to retrieve the container from the fourth position.

13. The buffer stocker of claim 12, wherein the second end of the second elongated conveyor belt extends longitudinally beyond the first end of the first elongated conveyor belt.

14. The buffer stocker of claim 12, comprising a third conveyor belt having a first end and a second end, wherein the transport track comprises a fifth position corresponding to the first end of the third conveyor belt, wherein the third conveyor belt is positioned vertically directly beneath the second elongated conveyor belt, wherein the first end of the third conveyor belt extends longitudinally beyond the first end of the second elongated conveyor belt, wherein the third conveyor belt is configured to receive a container from one of the transport vehicles at the fifth position, and wherein the first elongated conveyor belt, the second elongated conveyor belt, and the third conveyor belt are overlapping in plan view.

15. The buffer stocker of claim 14, wherein the transport track comprises a sixth position corresponding to the second end of the third conveyor belt, wherein the third conveyor belt is configured to transport the container received at the first end to the second end, and wherein the transport vehicles are configured to retrieve the container from the sixth position.

16. The buffer stocker of claim 15, wherein the second end of the third conveyor belt extends longitudinally beyond the second end of the second elongated conveyor belt.

17. The buffer stocker of claim 15, comprising a controller operably connected to the first, second, and third conveyor belts and configured to control a direction of travel of the first, second, and third conveyor belts.

18. The buffer stocker of claim 17, wherein the transport vehicles are configured to load the first elongated conveyor belt to capacity before loading the second elongated conveyor belt and configured to load the second elongated conveyor belt to capacity before loading the third conveyor belt.

19. A buffer stocker system comprising:

an overhead transport track supporting a plurality of movable overhead transport vehicles each configured for carrying a container, the overhead transport track comprising at least a first position, a second position, a third position, and a fourth position;

a first elongated conveyor belt having a first end and a second end, the first end corresponding to the first position of the overhead transport track and the second end corresponding to the third position of the overhead transport track; and a second elongated conveyor belt having a first end and a second end, the first end corresponding to the second position of the overhead transport track and the second end corresponding to the fourth position of the overhead transport track, wherein the second elongated conveyor belt is positioned vertically directly beneath the first elongated conveyor belt, wherein the first elongated conveyor belt and the second elongated conveyor belt are overlapping in plan view, wherein the second elongated conveyor belt extends longitudinally beyond the first and second ends of the first elongated conveyor belt, wherein the first elongated conveyor belt and the second elongated conveyor belt are each configured to receive a container from one of the plurality of moveable overhead transport vehicles at respective first or second positions and transport the container to respective third and fourth positions, and wherein the plurality of moveable overhead transport vehicles are configured to retrieve the container from the second end of one of the first or second elongated conveyor belts.

20. The buffer stocker of claim 19, comprising:

a third conveyor belt having a first end and a second end, the first end corresponding to a fifth position of the overhead transport track and the second end corresponding to a sixth position of the overhead transport track, wherein the third conveyor belt is positioned vertically directly beneath the second elongated conveyor belt, wherein the first elongated conveyor belt, the second elongated conveyor belt, and the third conveyor belt are overlapping in plan view, wherein the third conveyor belt extends longitudinally beyond the first and second ends of the second elongated conveyor belt, wherein the third conveyor belt is configured to receive a container from one of the plurality of moveable overhead transport vehicles at the fifth position and transport the container to the sixth position, and wherein the plurality of moveable overhead transport vehicles are configured to retrieve the container from the second end of the third conveyor belt.

* * * * *